(12) United States Patent
Moran et al.

(10) Patent No.: US 12,136,914 B2
(45) Date of Patent: Nov. 5, 2024

(54) CONTROL CIRCUIT FOR TRANSISTOR WITH FLOATING SOURCE NODE

(71) Applicant: Board of Trustees of Michigan State University, East Lansing, MI (US)

(72) Inventors: Kevin David Moran, Trenton, MI (US); Guoming George Zhu, Novi, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 24 days.

(21) Appl. No.: 17/972,713

(22) Filed: Oct. 25, 2022

(65) Prior Publication Data
US 2023/0133293 A1 May 4, 2023

Related U.S. Application Data

(60) Provisional application No. 63/272,727, filed on Oct. 28, 2021.

(51) Int. Cl.
*H03K 17/687* (2006.01)
*H01F 38/12* (2006.01)

(52) U.S. Cl.
CPC .......... *H03K 17/687* (2013.01); *H01F 38/12* (2013.01); *H03K 2217/0054* (2013.01); *H03K 2217/0081* (2013.01)

(58) Field of Classification Search
None
See application file for complete search history.

(56) References Cited

U.S. PATENT DOCUMENTS

| | | | | |
|---|---|---|---|---|
| 7,049,863 B2 * | 5/2006 | Bechman | ............. | H03K 17/163 |
| | | | | 327/108 |
| 8,723,564 B2 * | 5/2014 | Umetani | ............. | H03K 17/063 |
| | | | | 327/109 |
| 8,773,177 B2 * | 7/2014 | Kikuchi | ........... | H03K 17/04123 |
| | | | | 327/108 |
| 2011/0215840 A1 * | 9/2011 | Machida | ................. | H03K 3/00 |
| | | | | 327/309 |

* cited by examiner

*Primary Examiner* — Kenneth B Wells
(74) *Attorney, Agent, or Firm* — Harness, Dickey & Pierce, PLC

(57) ABSTRACT

A control circuit is provided for a field-effect transistor with a floating source node. The control circuit includes: a charge storage device electrically connected between a gate of the field-effect transistor and a DC power supply; a gate control circuit electrically connected between the charge storage device and the gate of the field-effect transistor; and a charge control circuit electrically connected between the DC power supply and the charge storage device. The gate control circuit is configured to receive a gate control signal and operates to turn on the field-effect transistor during on time of the gate control signal and turn off the field-effect transistor during off time of the gate control signal. The charge control circuit is also configured to receive the gate control signal and operates to charge the charge storage device with power from the DC power supply during off time of the gate control signal.

20 Claims, 3 Drawing Sheets

CONTROL CIRCUIT FOR TRANSISTOR WITH FLOATING SOURCE NODE

CROSS-REFERENCE TO RELATED APPLICATIONS

This application claims the benefit of U.S. Provisional Application No. 63/272,727, filed Oct. 28, 2021. The entire disclosure of the above application is incorporated herein by reference.

FIELD

The present disclosure relates to control circuit for powering a transistor with a floating source node.

BACKGROUND

When transistors are used in applications where the source or emitter node cannot be continually tied to a constant voltage, such as shorting a component located in the middle of a circuit, a floating supply is required to control the transistor. Typical floating supply circuits using switching circuitry to control transformers, inductors or capacitors add complexity and expense to the circuit design.

If the duty cycle "ON" state time is reasonably low, the transistor current requirements are low as when using field-effect transistors, the floating source node is guaranteed to remain positive or equal to the power supply ground, and the source node can be grounded during the "OFF" state, then a simpler floating power supply can be implemented using a capacitor that charges during the "OFF" state and floats during the "ON" state. For long period applications, a rechargeable battery may be used in place of a capacitor.

Electrical and electronic circuits generally have a power supply or supplies that are referenced to a common node; a neutral in the case of AC circuits or ground in the case of DC circuits. A floating power supply is a special case whereas the ground reference of the floating power supply needs to be decoupled from the common ground reference of the other power supplies and is allowed to follow another reference signal.

Considerations such as power requirement, size, and cost go into designing a floating power supply. Most all designs include a switching circuit and at least one capacitor; some include a transformer or inductor. One typical type of a floating power supply design involves a transformer with an electrically isolated secondary winding, a switching circuit controlling the primary winding and some regulation on the secondary winding. These circuits tend to be good for applications that require more power, but add considerable size and cost. Other designs use switching circuits with an inductor and capacitor or multiple capacitors. These circuits tend to provide moderate power, are smaller and are less expensive; but still require a switching circuit. Therefore, it is desirable to provide a control circuit for powering a transistor with a floating source node without the use of a transformer or a switching circuit.

This section provides background information related to the present disclosure which is not necessarily prior art.

SUMMARY

This section provides a general summary of the disclosure, and is not a comprehensive disclosure of its full scope or all of its features.

A control circuit is provided for a field-effect transistor with a floating source node. The control circuit includes: a charge storage device electrically connected between a gate of the field-effect transistor and a DC power supply; a gate control circuit electrically connected between the charge storage device and the gate of the field-effect transistor; and a charge control circuit electrically connected between the DC power supply and the charge storage device. The gate control circuit is configured to receive a gate control signal and operates to turn on the field-effect transistor during on time of the gate control signal and turn off the field-effect transistor during off time of the gate control signal. The gate control circuit further operates to electrically couple a source terminal of the field-effect transistor and a negative terminal of the charge storage device to ground during off time of the gate control signal. The charge control circuit is also configured to receive the gate control signal and operates to charge the charge storage device with power from the DC power supply during off time of the gate control signal.

In an example embodiment, the gate control circuit and the charge control circuit are implemented as follows. For the gate control circuit, a first switch is electrically coupled between the gate terminal of the field-effect transistor and ground, where the first switch is actuated open and close in accordance with a gate control signal. For example, the first switch is further defined as a transistor and the transistor electrically couples source terminal of the field-effect transistor to ground during off time of the gate control signal. For the charge control circuit, a third switch is electrically coupled between the DC power supply and the charge storage device, where the third switch is actuated open and close in accordance with the gate control signal such that the field-effect transistor is turned on during on time of the gate control signal and turned off during off time of the gate control signal and the charge storage device is charged with power from the DC power supply during off time of the gate control signal. It is noted that the field-effect transistor is electrically connected to the DC power source without the use of a transformer In some embodiments, the control circuit further includes a low-pass filter electrically coupled between the DC power source and the gate terminal of the third switch. The control circuit may also include a diode electrically coupled between the DC power source and a positive terminal of the charge storage device.

In one application, the field-effect transistor of the control circuit is electrically coupled to an ignition coil in a vehicle.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
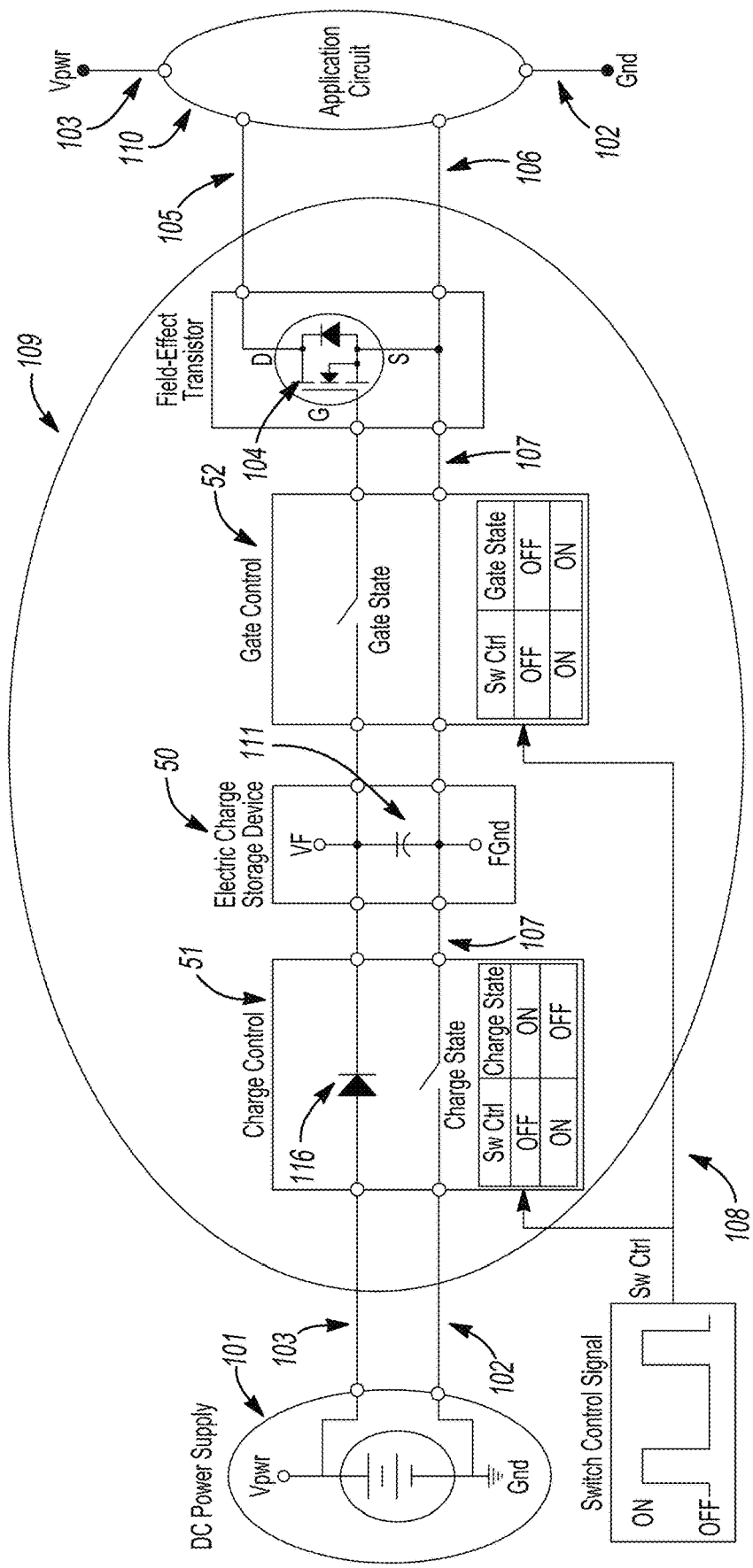
FIG. 1 is a block diagram of a control circuit for a transistor with a floating source node in accordance with this disclosure.

FIG. 1 depicts a control circuit 109 for powering a field-effect transistor 104 with a floating source node. The control circuit 109 is comprised of a gate control circuit 52, a charge control circuit 51 and a charge storage device 50. In this example, the transistor 104 is an enhancement mode N-channel MOSFET although other types of transistors are contemplated by this disclosure. The control circuit 109 connects to the drain terminal 105 and the source terminal 106 of the MOSFET. The control circuit 109 is also part of a larger circuit that includes a DC power supply 101 and an application circuit 110, such as an ignition circuit in a vehicle. For this application, the MOSFET has a requirement that it be grounded when the transistor is in an off state but allowed to float at or positive to ground node 102 when the transistor is in an on state. Thus, the source terminal 106 of the MOSFET is selectively coupled to floating ground node 107.

The gate control circuit 52 is electrically connected between the charge storage device 51 and the gate terminal of the MOSFET and is configured to receive a gate control signal 108, where the gate control signal is a rectangular pulse wave. During operation, the gate control circuit 52 turns on the field-effect transistor 104 during on time of the gate control signal and turns off the field-effect transistor 104 during off time of the gate control signal. Of note, the gate control circuit 52 operates to electrically couple the source terminal 106 of the field-effect transistor to ground during off time of the gate control signal.

The charge control circuit 51 is electrically connected between the DC power supply 101 and the charge storage device 50. The charge control circuit 51 is also configured to receive the gate control signal 108. During operation, the charge control circuit 51 charges the charge storage device 50 with power from the DC power supply 101 during off time of the gate control signal.

In this example, the charge storage device 50 is a capacitor 111. The charge storage device 50 can be any device capable of storing electric charge. When selecting the charge storage device 50 considerations include the storage capacity required, charge rate, discharge rate, component size, durability, and cost. For applications with short charge periods, such as on the order of milliseconds, a capacitor is typically well suited. For applications with longer charge periods, such as on the order of seconds or minutes, a rechargeable battery may be better suited. The control circuit 109 is well suited to control a switching device or other devices which require some electric charge to turn them on but minimal current to hold them in the on state.

Figure 2:
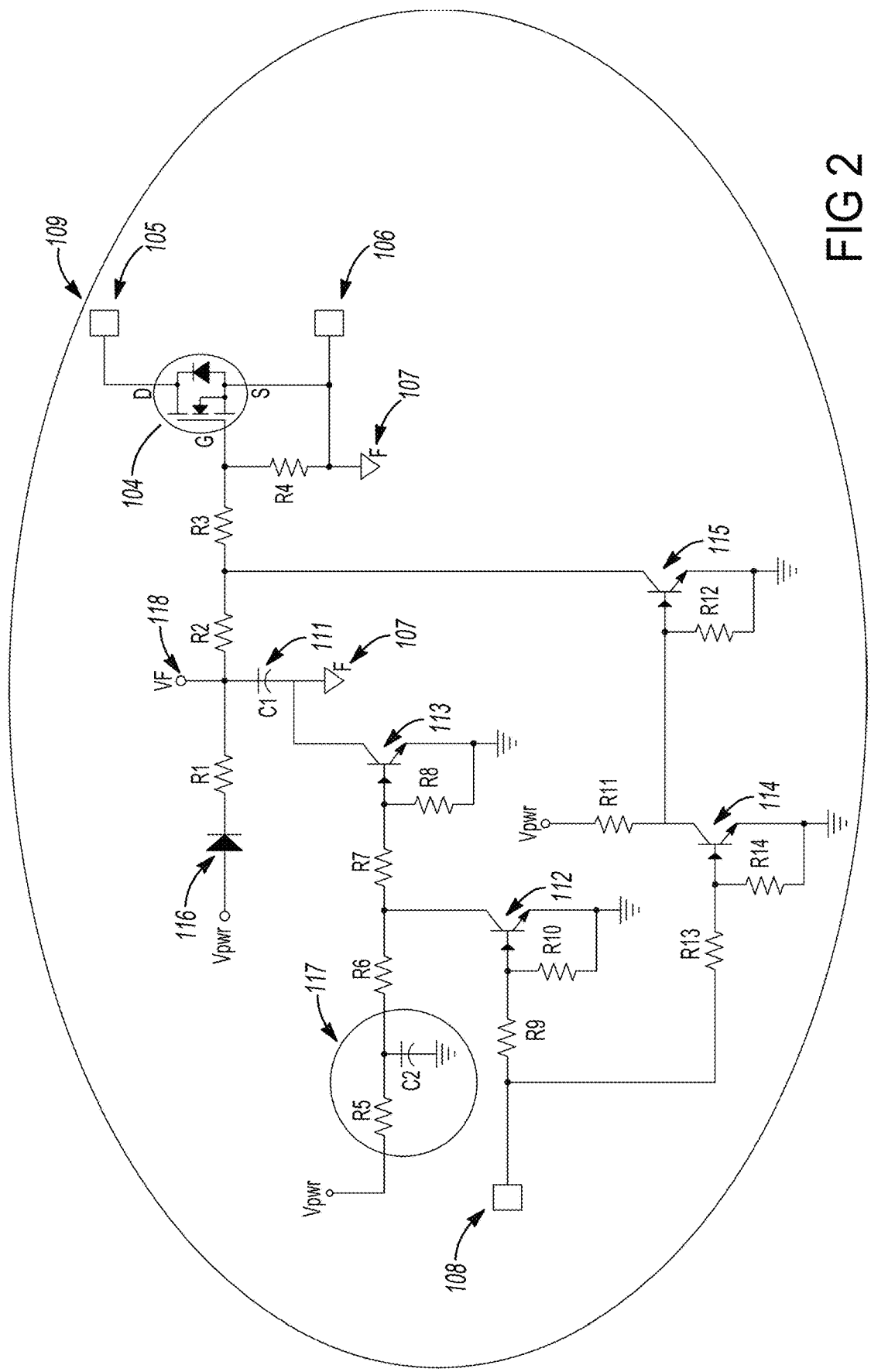
FIG. 2 is a schematic of an example embodiment of the control circuit.

FIG. 2 depicts an example embodiment of the control circuit 109 which powers MOSFET 104. The drain terminal 105 and the source terminal 106 of the MOSFET 104 can be electrically coupled to an application circuit as noted above. The gate terminal of the MOSFET is electrically coupled via diode 116 to the DC power supply. The gate terminal of the MOSFET 104 is also electrically coupled to a floating ground node 107.

Capacitor C1 111 serves as the charge storage device. The capacitor 111 has one terminal coupled to the floating ground node 107 and the other terminal coupled to a node, where the node is interposed between the diode 116 and the gate terminal of the MOSFET 104. During operation, the capacitor 111 stores charge when the MOSFET 104 is in an off state and supplies charge to transition to and hold the MOSFET 104 in the on state.

In the example embodiment, the gate control circuit 52 is comprised primarily of a first switch 115 and a second switch 114; whereas, the charge control circuit 51 is primarily comprised of a third switch 111 and a fourth switch 112. More specifically, the first switch 115, the second switch 114, the third switch 111 and the fourth switch 112 are implemented by respective transistors. The transistors 112, 113, 114, 115 in turn operate in either cutoff mode or saturation mode in accordance with the gate control signal 108 as further described below.

The first transistor 115 is electrically coupled between the gate terminal of the MOSFET 104 and ground. That is, the source terminal of the first transistor 115 is electrically coupled to the gate terminal of the MOSFET 104 and the drain terminal of the first transistor 115 is electrically coupled to ground. The second transistor 114 is configured to turn on and off the first transistor 115. To do so, the gate terminal of the second transistor 114 receives gate control signal 108 and the source terminal of the second transistor 114 is electrically coupled to the gate terminal of the first transistor.

The third transistor 113 is electrically coupled between the charge storage device 111 and ground. That is, the source terminal of the third transistor 113 is electrically coupled to one terminal of capacitor 111 and the drain terminal of the third transistor 113 is electrically coupled to ground. The fourth transistor 112 is configured to turn on and off the third transistor 113. To do so, the gate terminal of the fourth transistor 112 receives gate control signal 108 and the source terminal of the fourth transistor 112 is electrically coupled to the gate terminal of the third transistor 113.

During the time the switch control signal 108 is in an off state, the first and third transistors 113, 115 are in an on state while the second and fourth transistors 112 and 114 are in an off state. First transistor 115 in turn pulls the charge off the gate terminal of the MOSFET 104 and keeps the MOSFET 104 in an off state. Third transistor 113 connects the floating ground node 107 to the ground and thereby allows the diode 116 to forward bias, charging the capacitor 111. The diode 116 is electrically coupled between the positive terminal of the DC power supply and the positive terminal of the charge storage device so that during the on time of the field-effect transistor, the floating ground node exceeds the ground voltage of the DC power supply and the charge storage device is allowed to float with the floating ground node.

During the time the switch control signal 108 is in an on state, the first and third transistors 113, 115 are in an off state while the second and fourth transistors 112 and 114 are in an on state. In this case, the third transistor 113 decouples the floating ground node 107 from ground and the first transistor 115 allows the capacitor 111 to supply charge to the gate terminal of the MOSFET 104, thereby turning the MOSFET 104 to the "ON" state. States of the transistors are shown in the table below.

| Switch Control Signal State | Transistors | | | | |
| --- | --- | --- | --- | --- | --- |
| | 112 | 113 | 114 | 115 | 104 |
| OFF | OFF | ON* | OFF | ON | OFF |
| ON | ON | OFF | ON | OFF | ON |

It is important that the MOSFET 104 turns completely off before connecting the floating ground node 107 to the ground. In this example embodiment, this is accomplished by employing a first-order low pass filter 117 which slows down the activation (or turning on) of the third transistor. Other techniques for achieving this timing are also contemplated by this disclosure.

With continued reference to FIG. 2, the capacitor 111 needs to be sized so that it stores enough charge so the voltage Vf 118 does not drop below an acceptable level before the end of the MOSFET 104 "ON" cycle. Resistor R1 is sized to provide an acceptable time-constant tau so that the capacitor 111 can be adequately charged during the MOSFET 104 "OFF" time. Resistor R2 needs to be sized to meet two requirements: first, it needs to be large enough so that when transistor 115 is in saturation mode the current through resistor R2 is sufficiently limited; and second, it needs to be small enough so that when transistor 115 is in cutoff mode and the MOSFET 104 is turning on the resistance does not overly limit the current to the gate of MOSFET 104, excessively slowing down the turn on time of MOSFET 104. Resistor R3 needs to be sized small enough so that when transistor 115 turns from cutoff to saturation mode, the charge can be removed from the MOSFET 104 gate quickly, turning MOSFET 104 to the "OFF" state. The turn off time of MOSFET 104 will determine the time constant tau of the first order low-pass filter 117. When determining the time constant tau of the first order low-pass filter 117, the initial voltage across the capacitor C2 needs to be considered; it will be the voltage divider created by resistors R5 and R6 when transistor 112 is in saturation mode. Resistor R6 needs to be sized small enough to guarantee that the charge is pulled off C2 before the next MOSFET 104 "ON" state time. Values for the capacitors and resistors in the example embodiment are listed in Table 2 below.

| Component | Value |
|---|---|
| C1 | 100 μF |
| C2 | 47 nF |
| R1 | 100 Ω |
| R2 | 282 Ω |
| R3 | 12 Ω |
| R4 | 20 kΩ |
| R5 | 5 kΩ |
| R6 | 50 Ω |
| R7 | 500 Ω |
| R8 | 20 kΩ |
| R9 | 1 kΩ |
| R10 | 20 kΩ |
| R11 | 1 kΩ |
| R12 | 20 kΩ |
| R13 | 1 kΩ |
| R14 | 20 kΩ |

While an exemplary embodiment has been described above with specific components having specific values and arranged in a specific configuration, it will be appreciated that this control circuit may be constructed with many different configurations, components, and/or values as necessary or desired for a particular application. The above configurations, components and values are presented only to describe one particular embodiment that has proven effective and should be viewed as illustrating, rather than limiting, the inventive concept.

In this example an N-channel FET is used so the negative node of the capacitor 111 is attached to the FET source node and the positive node of the capacitor 111 remains constant referenced to the negative node of the capacitor 111. The same principles can be applied to a P-channel FET by inverting the circuit, attaching the positive node of the capacitor 111 to the FET floating source node and the negative node of the capacitor 111 would then remain constant referenced to the positive node of the capacitor 111. P-channel FET designs would require other details to be inverted as well.

Figure 3:
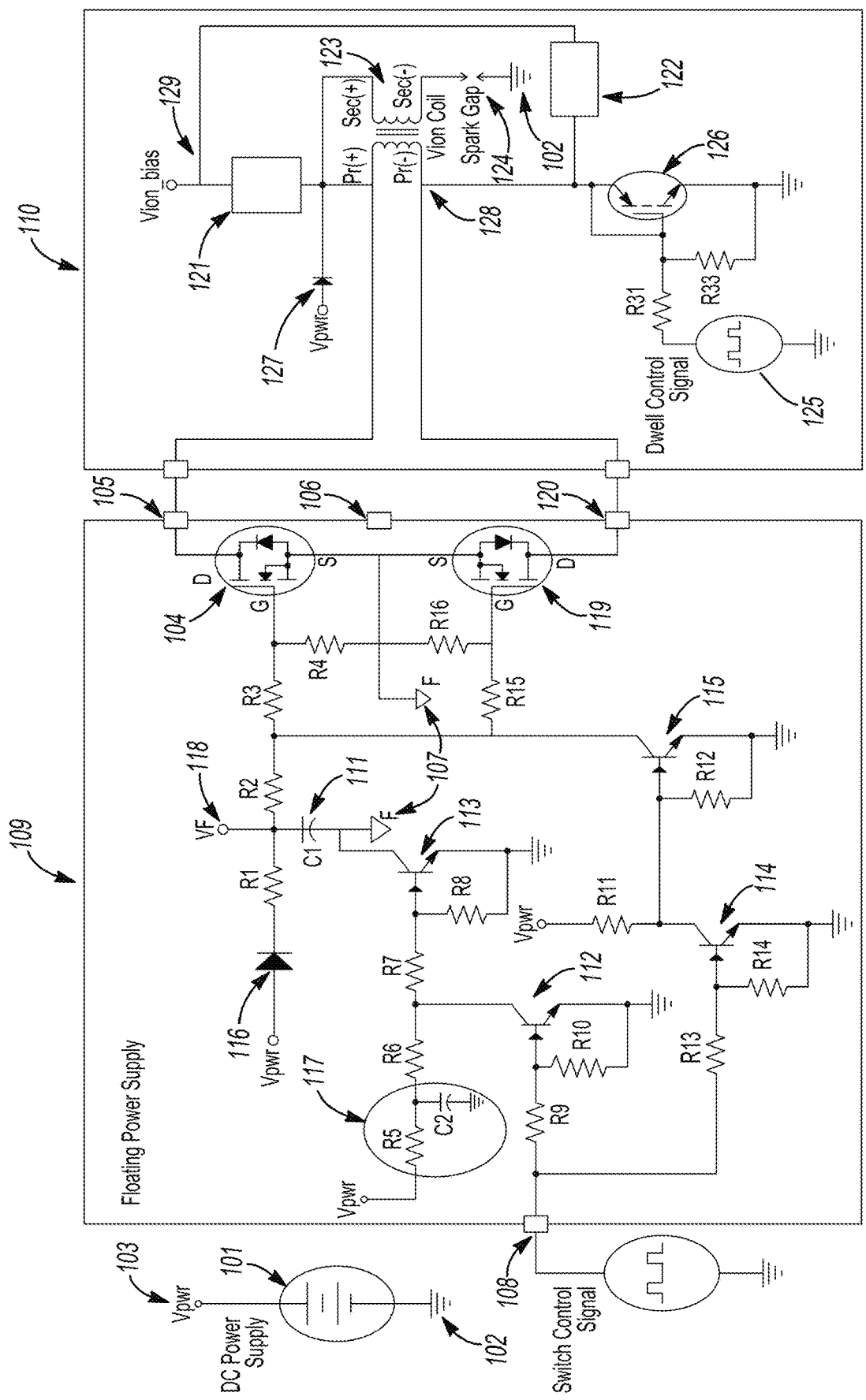
FIG. 3 is a schematic of the control circuit interfaced with an ignition circuit of a vehicle.

FIG. 3 illustrates an example application for the control circuit described above. In this example, the control circuit 109 is interfaced with an ignition circuit 110. Rather than having one MOSFET, the control circuit 109 controls the operation of two MOSFETs 104 and 119. The ignition circuit 100 includes a diagnostic circuit 121 for sampling and conditioning an ionization current signal in a combustion chamber and power supply circuit 122 for in-cylinder ionization detection using ignition coil flyback energy. The diagnostic circuit 121 is further described in U.S. Pat. No. 7,197,913 and the power supply circuit 122 is further described in U.S. Pat. No. 7,005,855; both of which are incorporated by reference in their entirety herein.

This application uses the ignition coil 123 and spark plug 124 for both igniting the air/fuel mixture in the engine cylinder and as a path to measure the degree of ionization occurring during the combustion phase of the engine cycle. The dwell control signal 125 controls the switching transistor 126. When the dwell control signal 125 goes high, the switching transistor 126 turns to the "ON" state and diode 127 is forward biased causing ignition coil 123 to dwell. When the dwell control signal 125 goes low, transitioning the switching transistor 126 to the "OFF" state, the ignition coil 123 primary (−) node 128 flyback Voltage increases to the switching transistor 126 clamp voltage, Vclamp, typically on the order of 500 Volts, until the ignition coil 123 energy is expended. This transition causes the spark plug 124 to ignite the air/fuel mixture in the engine cylinder. The power supply circuitry 122 uses the ignition coil 123 flyback energy to create the ionization bias supply voltage 129, Vion_bias. During the next phase of the engine cycle (i.e., the combustion cycle), the diode 127 is reverse biased and the ionization supply voltage 129 is applied across the spark plug gap 124 with the resulting ionization current being measured by the ionization diagnostics circuitry 121.

When the inductance of the ignition coil 123 is too high, a parasitic filter is formed and higher frequency components of the ionization current signal are attenuated. For applications with high inductance ignition coils shorting the ignition coil 123, primary inductance can be shorted using the method described in U.S. Pat. No. 10,221,827, thereby reducing the filtering effect. The use of two MOSFETs 104 and 119 are required so that the body diodes prevent each other from conducting as the polarity of the ignition coil 123 primary voltage flips between positive and negative as the system moves through the dwell/ignition/combustion process. Table 3 below provides example voltages for the MOSFETs 104 and 119 and the drain nodes 105 and 120 as the system progress through the dwell/ignition/combustion process.

| Process Phase | Dwell Control Signal 125 | Switch Control Signal 108 | VPri(+) 105 | VPri(−) 120 | Vpri |
|---|---|---|---|---|---|
| Idle | OFF | OFF | Vion_bias | | 0 |
| Dwell | ON | OFF | 14 V | GND | +14 V |
| Ignition | OFF | OFF | 14 V | 500 V | −486 V |

-continued

| Process Phase | Dwell Control Signal 125 | Switch Control Signal 108 | VPri(+) 105 | VPri(−) 120 | Vpri |
|---|---|---|---|---|---|
| Combustion | OFF | ON | V(ionization current) | | +(<Vion_bias) |
| Idle | OFF | OFF | Vion_bias | | 0 |

Further details regarding the need for a floating power supply to control the MOSFETs 104 and 119 is set forth in U.S. Pat. No. 10,221,827 which is incorporated by reference in its entirety herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A control circuit for a field-effect transistor with a floating source node, comprising:
    a charge storage device electrically connected between a gate of the field-effect transistor and a DC power supply;
    a gate control circuit electrically connected between the charge storage device and the gate of the field-effect transistor and configured to receive a gate control signal, where the gate control signal is a rectangular pulse wave; and
    a charge control circuit electrically connected between the DC power supply and the charge storage device and configured to receive the gate control signal;
    wherein the gate control circuit operates to turn on the field-effect transistor during the on time of the gate control signal and turn off the field-effect transistor during the off time of the gate control signal;
    wherein the charge control circuit operates to charge the charge storage device with power from the DC power supply during off time of the gate control signal;
    wherein the gate control circuit operates to electrically couple a source terminal of the field-effect transistor and a negative terminal of the charge storage device to ground during off time of the gate control signal.

2. The control circuit of claim 1 wherein the gate control circuit includes a first switch electrically coupled between the gate terminal of the field-effect transistor and ground.

3. The control circuit of claim 2 wherein the charge control circuit includes a second switch electrically coupled between the DC power supply and the charge storage device.

4. The control circuit of claim 2 wherein the charge control circuit further operates to delay activation of the second switch during transition from the on time of the gate control signal to the off time of the gate control signal.

5. The control circuit of claim 1 wherein the field-effect transistor is electrically connected to the DC power supply without the use of a transformer.

6. The control circuit of claim 1 wherein the charge storage device is a capacitor.

7. The control circuit of claim 1 wherein the field-effect transistor is electrically coupled to an ignition coil in a vehicle.

8. A control circuit, comprising:
    a field-effect transistor having a source terminal electrically coupled to a floating ground node;
    a charge storage device electrically connected between a gate terminal of the field-effect transistor and a DC power supply;
    a first switch electrically coupled between the gate terminal of the field-effect transistor and ground, wherein the first switch is actuated open and close in accordance with a gate control signal, where the gate control signal is a rectangular pulse wave; and
    a second switch electrically coupled between the DC power supply and the charge storage device, wherein the second switch is actuated open and close in accordance with the gate control signal such that the field-effect transistor is turned on during on time of the gate control signal and turned off during off time of the gate control signal and the charge storage device is charged with power from the DC power supply during off time of the gate control signal.

9. The control circuit of claim 8 wherein the first switch is a transistor and the transistor electrically couples the source terminal of the field-effect transistor to ground during the off time of the gate control signal.

10. The control circuit of claim 9 wherein the second switch is a transistor.

11. The control circuit of claim 10 further including a low-pass filter electrically coupled between the DC power supply and the gate terminal of the second switch.

12. The control circuit of claim 8 further comprising a diode electrically coupled between the DC power supply and a positive terminal of the charge storage device.

13. The control circuit of claim 8 wherein the field-effect transistor is electrically connected to the DC power supply without the use of a transformer.

14. The control circuit of claim 8 wherein the charge storage device is a capacitor.

15. The control circuit of claim 8 wherein the field-effect transistor is electrically coupled to an ignition coil in a vehicle.

16. A control circuit for a field-effect transistor with a floating source node, comprising:
    a charge storage device electrically connected between a gate of the field-effect transistor and a DC power supply;
    a gate control circuit electrically connected between the charge storage device and the gate of the field-effect transistor and configured to receive a gate control signal; and
    a charge control circuit electrically connected between the DC power supply and the charge storage device and configured to receive the gate control signal;
    wherein the gate control circuit operates to turn on the field-effect transistor during the on time of the gate control signal and turn off the field-effect transistor during the off time of the gate control signal;
    wherein the gate control circuit further operates to electrically couple a source terminal of the field-effect transistor and a negative terminal of the charge storage device to ground during off time of the gate control signal;
    wherein the charge control circuit operates to charge the charge storage device with power from the DC power supply during off time of the gate control signal;

wherein the gate control circuit includes a first switch electrically coupled between the gate terminal of the field-effect transistor and ground; and wherein the charge control circuit includes a second switch electrically coupled between the DC power supply and the charge storage device.

17. The control circuit of claim 16 wherein the charge control circuit further operates to delay activation of the second switch during transition from the on time of the gate control signal to the off time of the gate control signal.

18. The control circuit of claim 16 wherein the field-effect transistor is electrically connected to the DC power supply without the use of a transformer.

19. The control circuit of claim 16 wherein the charge storage device is a capacitor.

20. The control circuit of claim 16 wherein the field-effect transistor is electrically coupled to an ignition coil in a vehicle.

\* \* \* \* \*